United States Patent
Gonska et al.

(10) Patent No.: US 9,123,716 B2
(45) Date of Patent: Sep. 1, 2015

(54) METHOD FOR BONDING TWO SILICON SUBSTRATES, AND A CORRESPONDEING SYSTEM OF TWO SILICON SUBSTRATES

(71) Applicants: Julian Gonska, Reutlingen (DE); Heribert Weber, Nuertingen (DE); Jens Frey, Filderstadt (DE); Timo Schary, Bremen (DE); Thomas Mayer, Reutlingen (DE)

(72) Inventors: Julian Gonska, Reutlingen (DE); Heribert Weber, Nuertingen (DE); Jens Frey, Filderstadt (DE); Timo Schary, Bremen (DE); Thomas Mayer, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 13/719,799

(22) Filed: Dec. 19, 2012

(65) Prior Publication Data
US 2013/0161820 A1 Jun. 27, 2013

(30) Foreign Application Priority Data
Dec. 22, 2011 (DE) .......... 10 2011 089 569

(51) Int. Cl.
| | |
|---|---|
| H01L 21/00 | (2006.01) |
| H01L 23/48 | (2006.01) |
| H01L 21/50 | (2006.01) |
| H01L 23/488 | (2006.01) |
| H01L 21/18 | (2006.01) |
| B81C 1/00 | (2006.01) |
| H01L 23/00 | (2006.01) |

(52) U.S. Cl.
CPC ............ *H01L 21/50* (2013.01); *B81C 1/00269* (2013.01); *H01L 21/185* (2013.01); *H01L 21/187* (2013.01); *H01L 23/488* (2013.01); *H01L 24/94* (2013.01); *B81B 2201/0235* (2013.01); *B81B 2201/0264* (2013.01); *B81C 2203/0118* (2013.01); *B81C 2203/035* (2013.01); *H01L 2224/83805* (2013.01); *H01L 2924/0132* (2013.01); *H01L 2924/10253* (2013.01); *H01L 2924/16251* (2013.01)

(58) Field of Classification Search
CPC ..... H01L 21/50; H01L 23/488; H01L 21/185; H01L 21/187; H01L 24/94; H01L 2924/16251; H01L 2924/10253; H01L 2924/0132; H01L 2224/83805; H01L 2924/132; H01L 2924/01013; B81C 1/00269; B81C 2203/0118
USPC .......... 438/107, 687, 630, 642, 688; 257/771, 257/770, 776
See application file for complete search history.

(56) References Cited

U.S. PATENT DOCUMENTS

| | | | | |
|---|---|---|---|---|
| 5,897,331 | A * | 4/1999 | Sopori | 438/90 |
| 6,201,261 | B1 * | 3/2001 | Sopori | 257/72 |
| 7,442,570 | B2 * | 10/2008 | Nasiri et al. | 438/48 |
| 2006/0208326 | A1 * | 9/2006 | Nasiri et al. | 257/414 |
| 2008/0283990 | A1 | 11/2008 | Nasiri et al. | |

* cited by examiner

*Primary Examiner* — Thinh T Nguyen
(74) *Attorney, Agent, or Firm* — Kenyon & Kenyon LLP

(57) ABSTRACT

A method for bonding two silicon substrates and a corresponding system of two silicon substrates. The method includes: providing first and second silicon substrates; depositing a first bonding layer of pure aluminum or of aluminum-copper having a copper component between 0.1 and 5% on a first bonding surface of the first silicon substrate; depositing a second bonding layer of germanium above the first bonding surface or above a second bonding surface of the second silicon substrate; subsequently joining the first and second silicon substrates, so that the first and the second bonding surfaces lie opposite each other; and implementing a thermal treatment step to form an eutectic bonding layer of aluminum-germanium or containing aluminum-germanium as the main component, between the first silicon substrate and the second silicon substrate, spikes which contain aluminum as a minimum and extend into the first silicon substrate, forming at least on the first bonding surface.

14 Claims, 7 Drawing Sheets

METHOD FOR BONDING TWO SILICON SUBSTRATES, AND A CORRESPONDEING SYSTEM OF TWO SILICON SUBSTRATES

RELATED APPLICATION INFORMATION

The present application claims priority to and the benefit of German patent application no. 10 2011 089 569.8, which was filed in Germany on Dec. 22, 2011, the disclosure of which is incorporated herein by reference.

FIELD OF THE INVENTION

The present invention relates to a method for bonding two silicon substrates, and to a corresponding system of two silicon substrates.

BACKGROUND INFORMATION

Although various types of micromechanical substrates can be used, the present invention and the problem underlying it are explained on the basis of wafer substrates on silicon basis.

In the related art, e.g., in US 2008/0283990 A1, eutectic bond connections between substrates are described, for which aluminum/silicon/copper are used.

U.S. Pat. No. 7,442,570 B2 discusses a method for bonding two silicon substrates, in which an aluminum layer (not further described) is provided on an oxide layer, which is situated on a top surface of the substrate. This aluminum layer is eutectically bonded to a germanium layer situated on a further substrate. No aluminum spiking occurs in this process.

It is already known from the field of microelectronics to use aluminum with added silicon and copper for aluminum circuit tracks. Copper increases the current-carrying capacity of the circuit tracks, that is to say, improves the electrical migration resistance, while the addition of silicon is to prevent the known Al-spiking into the substrate. The formation of undesired aluminum spikes into the silicon substrate occurs mainly during thermal treatments, which are meant to improve/reduce the electrical contact resistance between aluminum circuit tracks and contact points of electrical components in the silicon substrate. Flat pn-junctions may be short-circuited in the process, which ultimately may lead to a breakdown of the component.

The spiking is a migration process of silicon and aluminum atoms, i.e., aluminum atoms migrate to the silicon substrate, while silicon atoms migrate to the aluminum. To prevent this behavior, normally, in the case of aluminum circuit tracks, silicon is added in the amount needed to reach the solubility limit thereof in aluminum. In practice this is achieved in that aluminum-silicon-copper targets suitable for sputtering are used during the deposition process of the aluminum circuit track layer.

SUMMARY OF THE INVENTION

The present invention provides a method for bonding two silicon substrates as described herein, and a corresponding system of two silicon substrates as described herein.

Advantageous further refinements constitute the subject matter of the respective further descriptions herein.

An aspect underlying the present invention is to provide aluminum layers which have no silicon component and selectively lead to spikes during the eutectic bonding of aluminum-germanium, at the connection surfaces of the silicon substrates, the spikes containing aluminum as a minimum. The aluminum bonding layer is a pure aluminum layer or an aluminum layer having a relatively low copper component.

Depending on the aluminum layer used (with/without Cu), it is also possible that Cu atoms are present in the eutecticum and in the Al spikes. In addition, Si atoms may be present here as well, which were dissolved out of the substrate during the Al spike formation. It is then possible that they attach to Ge atoms during the eutectic bonding and form SiGe clusters in the bonding interface.

The method according to the present invention allows the use of an aluminum-germanium eutecticum for bonding two or more silicon substrates, which makes it possible to produce a particularly good connection to the silicon substrates, in particular silicon wafer substrates.

The present invention utilizes the aluminum spiking into the silicon substrate, which usually is undesired in other applications, for the mechanical anchoring, and thus for improving the adhesion, of the eutectic bonding layer to the bonding surfaces of the silicon substrates. As a result, the present invention provides for selective spiking, which occurs because of the use of the pure aluminum layer or the aluminum copper layer without silicon component at the bonding surface.

Since spiking is a diffusion process, it is temperature- and time-dependent. The eutectic bonding process using aluminum and germanium may be carried out in the range between 425° C. and 500° C.

The selective spiking leads to virtual meshing between the eutectic bonding layer and the particular silicon substrate, which enlarges the bonding surface and improves the absorption of lateral and vertical forces.

Additional features and advantages of the present invention are elucidated in greater detail below, based on specific embodiments and with reference to the drawings.

DETAILED DESCRIPTION

In the figures, identical reference symbols denote identical or functionally equivalent elements.

Figure 1:
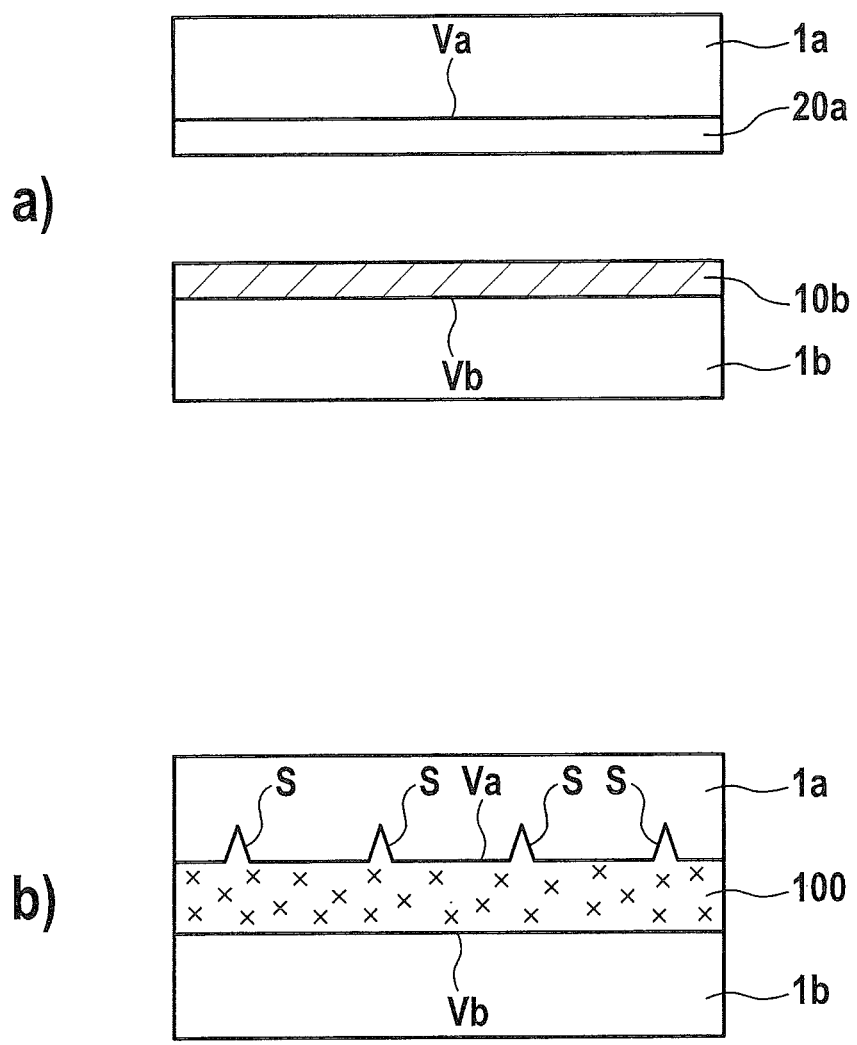
FIGS. 1a and 1b show schematic cross-sectional views to explain a method for bonding two silicon substrates, and a corresponding system of two silicon substrates according to a first specific embodiment of the present invention, that is, prior to the bonding, FIG. 1a and following the bonding, FIG. 1b.

FIG. 1a), b) show schematic cross-sectional views to explain a method for bonding two silicon substrates, and a corresponding system of two silicon substrates according to a first specific embodiment of the present invention, that is, prior to the bonding, FIG. 1a) and following the bonding, FIG. 1b). An exemplary field of use for the subject matter of the present invention is the bonding of a silicon sensor wafer to a silicon cap wafer, e.g., as required for rate-of-rotation sensors or acceleration sensors or pressure sensors.

In FIG. 1a), b), reference numeral 1a denotes a first silicon substrate having a first bonding surface Va, on which a first bonding layer 20a of pure aluminum or of aluminum-copper having a copper component of between 0.1 and 5%, which may be 0.5 and 1%, has been deposited.

Reference numeral 1b denotes a second silicon substrate having a second bonding surface Vb, on which a germanium layer 10b has been deposited.

Starting from the process state according to FIG. 1a), silicon substrates 1a, 1b are bonded in such a way that the first and the second bonding surfaces Va, Vb are situated opposite each other, i.e., layers 20a, 10b lie on top of each other. This is followed by a thermal treatment step to form a eutectic bonding layer 100 made of aluminum-germanium or containing aluminum germanium as main component, between first silicon substrate 1a and second silicon substrate 1b. The thermal treatment step may be performed in a range between 400° C. and 550° C., which may be between 425° C. and 500° C.

During the thermal treatment step, spikes S form on first bonding surface Va, where first bonding layer 20a of pure aluminum or of aluminum copper is situated, spikes S extending into first silicon substrate 1a. Spikes S contain aluminum with traces of silicon as main component, but spikes S may also contain germanium or copper in addition, depending on the bonding layer 20a actually used.

Figure 2:
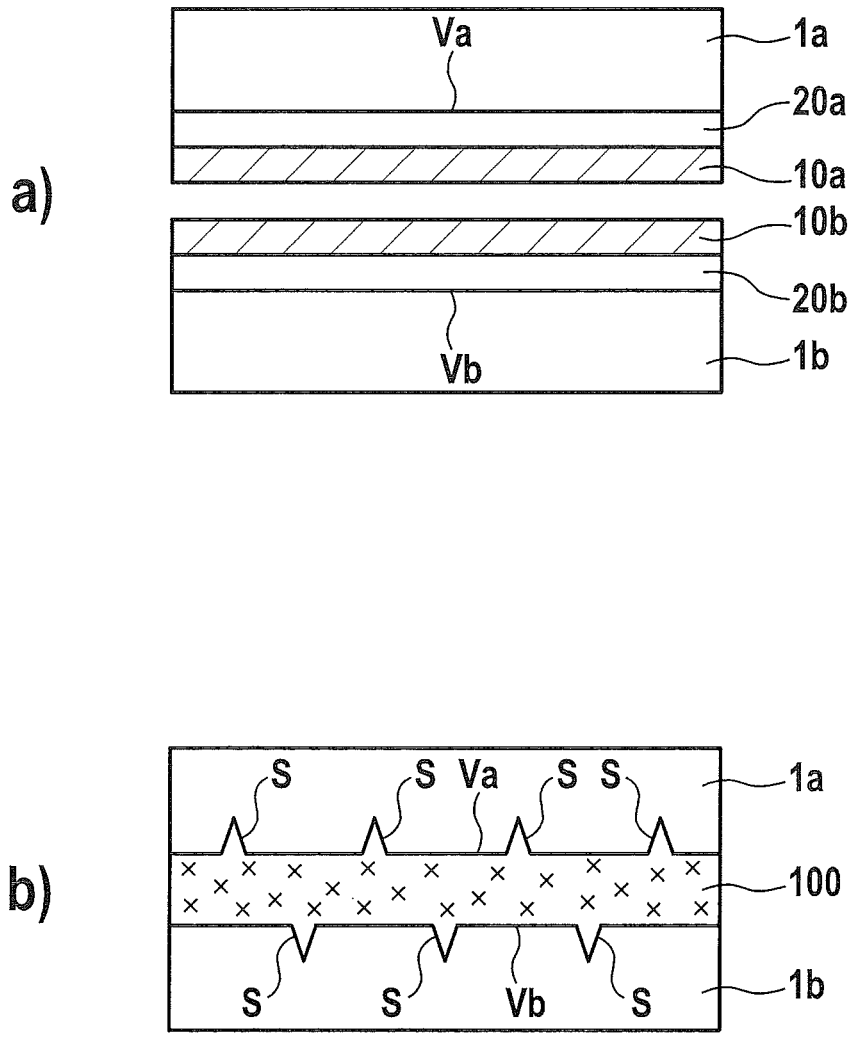
FIGS. 2a and 2b show schematic cross-sectional views to explain a method for bonding two silicon substrates, and a corresponding system of two silicon substrates according to a second specific embodiment of the present invention, that is, prior to the bonding, FIG. 2a and following the bonding, FIG. 2b.

FIG. 2a), b) show schematic cross-sectional views to explain a method for bonding two silicon substrates, and a corresponding system of two silicon substrates according to a second specific embodiment of the present invention, that is, prior to the bonding, FIG. 2a) and following the bonding, FIG. 2b).

In the second specific embodiment, a bonding layer 20a made of pure aluminum or of aluminum-copper having the mentioned copper component is situated on first bonding surface VA, and a bonding layer 20b, which likewise is made of pure aluminum or of aluminum-copper with the mentioned copper component, is situated on second bonding surface Vb. An additional bonding layer 10a made of germanium is deposited on bonding layer 20a, and another bonding layer 10b of germanium is deposited on bonding layer 20b.

As illustrated in FIG. 2b), the same thermal treatment step as in the first specific embodiment takes place, whereupon spikes S form not only on first bonding surface Va, but also on second bonding surface Vb, since a spike-promoting bonding layer 20b of pure aluminum or of aluminum-copper is provided here as well.

It should be mentioned that in the second specific embodiment, one of bonding layers 10a, 10b of germanium may also be omitted.

Figure 3:
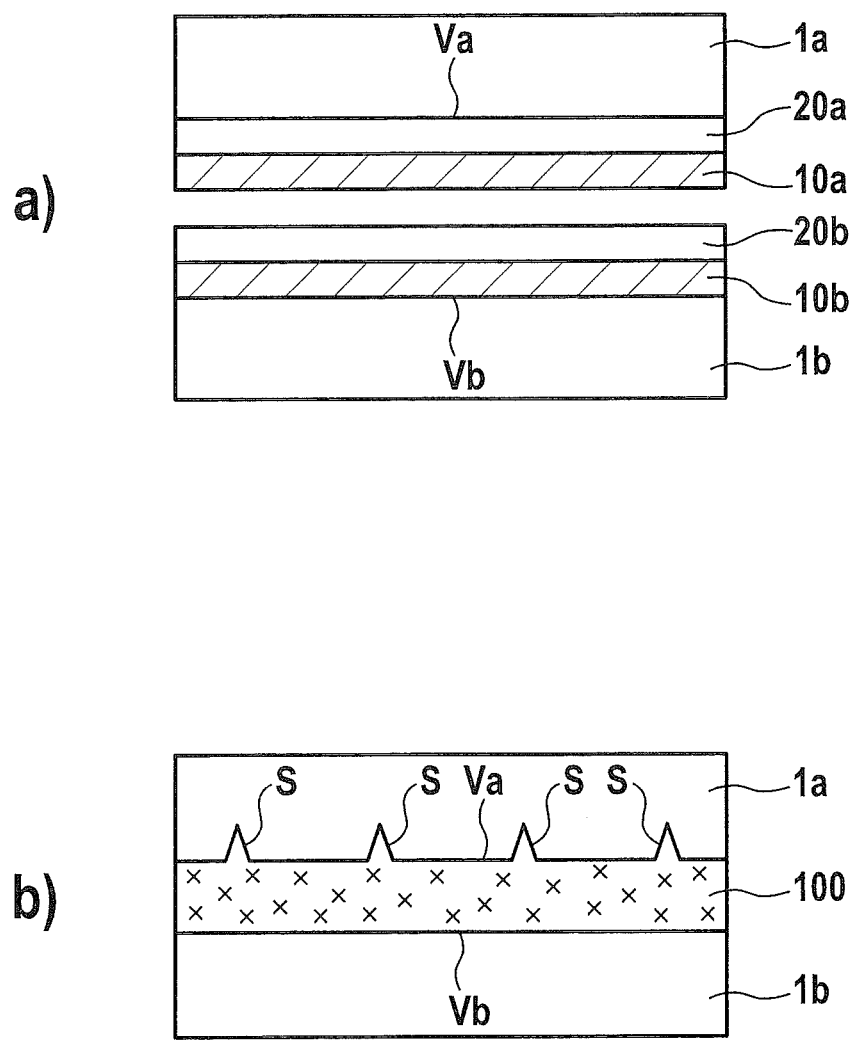
FIGS. 3a and 3b show schematic cross-sectional views to explain a method for bonding two silicon substrates, and a corresponding system of two silicon substrates according to a third specific embodiment of the present invention, that is, prior to the bonding, FIG. 3a and following the bonding, FIG. 3b.

FIG. 3a), b) show schematic cross-sectional views to explain a method for bonding two silicon substrates, and a corresponding system of two silicon substrates according to a third specific embodiment of the present invention, that is, prior to the bonding, FIG. 3a) and following the bonding, FIG. 3b).

The third specific embodiment differs from the second specific embodiment in that the sequence of layers 10b, 20b is reversed, that is to say, bonding layer 10b of germanium is situated on second bonding surface Vb, and bonding layer 20b of pure aluminum or aluminum-copper is situated on top of it. As illustrated in FIG. 3b), the formation of spikes S in this specific embodiment takes place in the same way as in the first specific embodiment, but on first bonding surface Va only.

Figure 4:
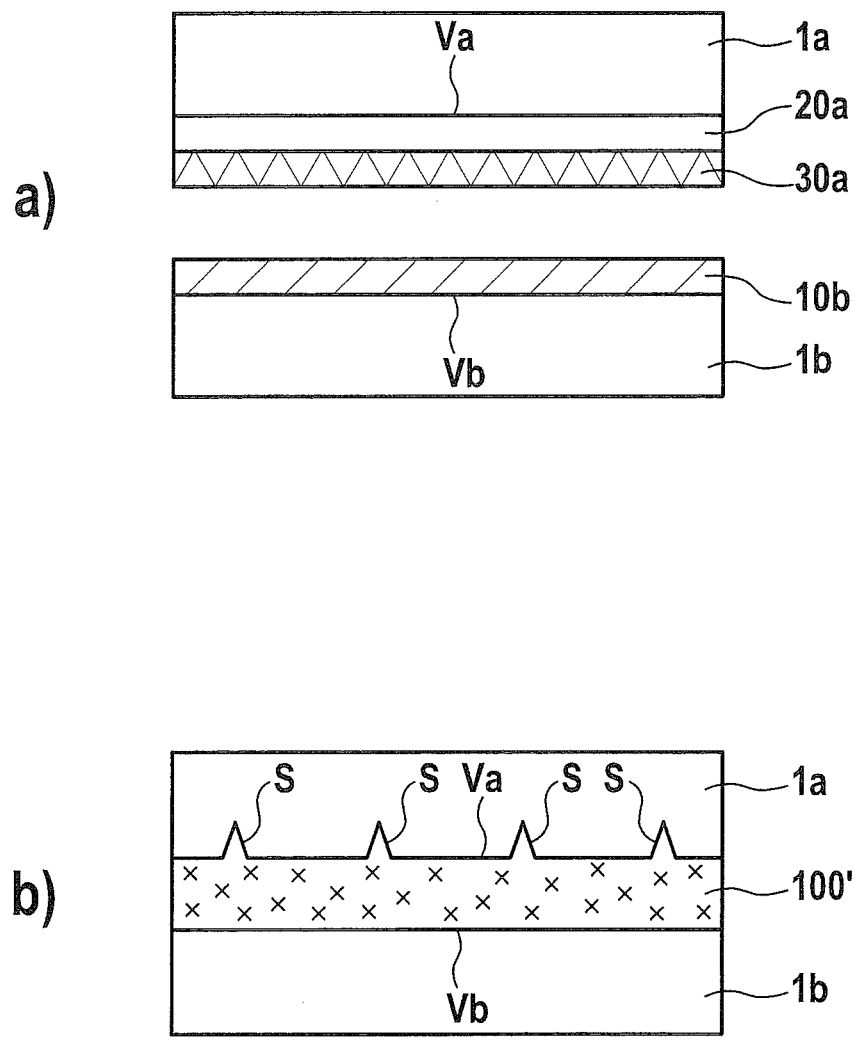
FIGS. 4a and 4b show schematic cross-sectional views to explain a method for bonding two silicon substrates, and a corresponding system of two silicon substrates according to a first specific embodiment of the present invention, that is, prior to the bonding, FIG. 4a and following the bonding, FIG. 4b.

FIG. 4a), b) show schematic cross-sectional views to explain a method for bonding two silicon substrates, and a corresponding system of two silicon substrates according to a first specific embodiment of the present invention, that is, prior to the bonding, FIG. 4a) and following the bonding, FIG. 4b).

In contrast to the first specific embodiment, in the fourth specific embodiment an additional bonding layer 30a of aluminum-silicon-copper has been deposited on bonding layer 20a, the silicon component, in addition to the aforementioned copper component, lying between 0.1 and 5%, which may be between 1 and 2%.

In this specific development as well, spikes form on first bonding surface Va during the thermal treatment step due to the presence of bonding layer 20a of pure aluminum or aluminum-copper having the aforementioned copper component. The eutectic bonding layer in this specific embodiment contains aluminum, germanium, copper and silicon and therefore is denoted by reference numeral 100'.

Figure 5:
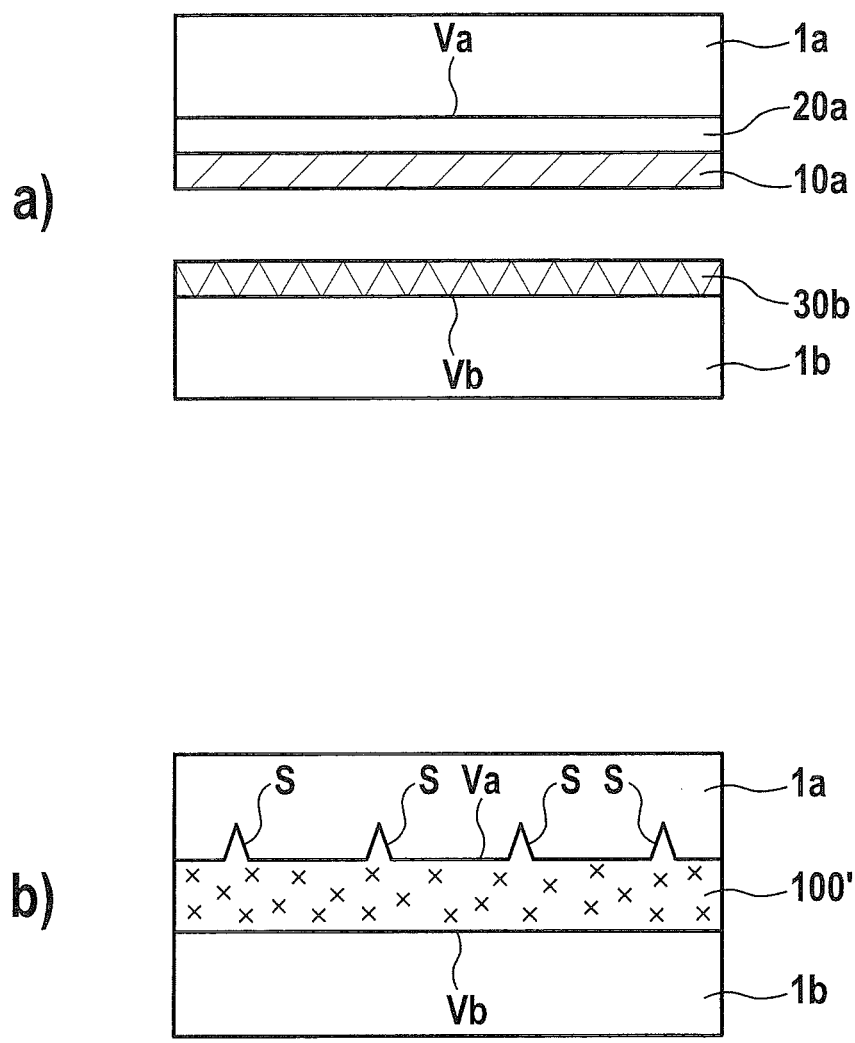
FIGS. 5a and 5b show schematic cross-sectional views to explain a method for bonding two silicon substrates, and a corresponding system of two silicon substrates according to a first specific embodiment of the present invention, that is, prior to the bonding, FIG. 5a and following the bonding, FIG. 5b.

FIG. 5a), b) show schematic cross-sectional views to explain a method for bonding two silicon substrates, and a corresponding system of two silicon substrates according to a first specific embodiment of the present invention, that is, prior to the bonding, FIG. 5a) and following the bonding, FIG. 5b).

In the fifth specific embodiment, a bonding layer 10a of germanium has been deposited on bonding layer 20a situated on first bonding surface Va.

A bonding layer 30b of aluminum-silicon-copper having the aforementioned copper component or silicon component, is deposited on second bonding surface Vb. As in the first specific embodiment, spikes S form only on first bonding surface Va during the thermal treatment step.

Figure 6:
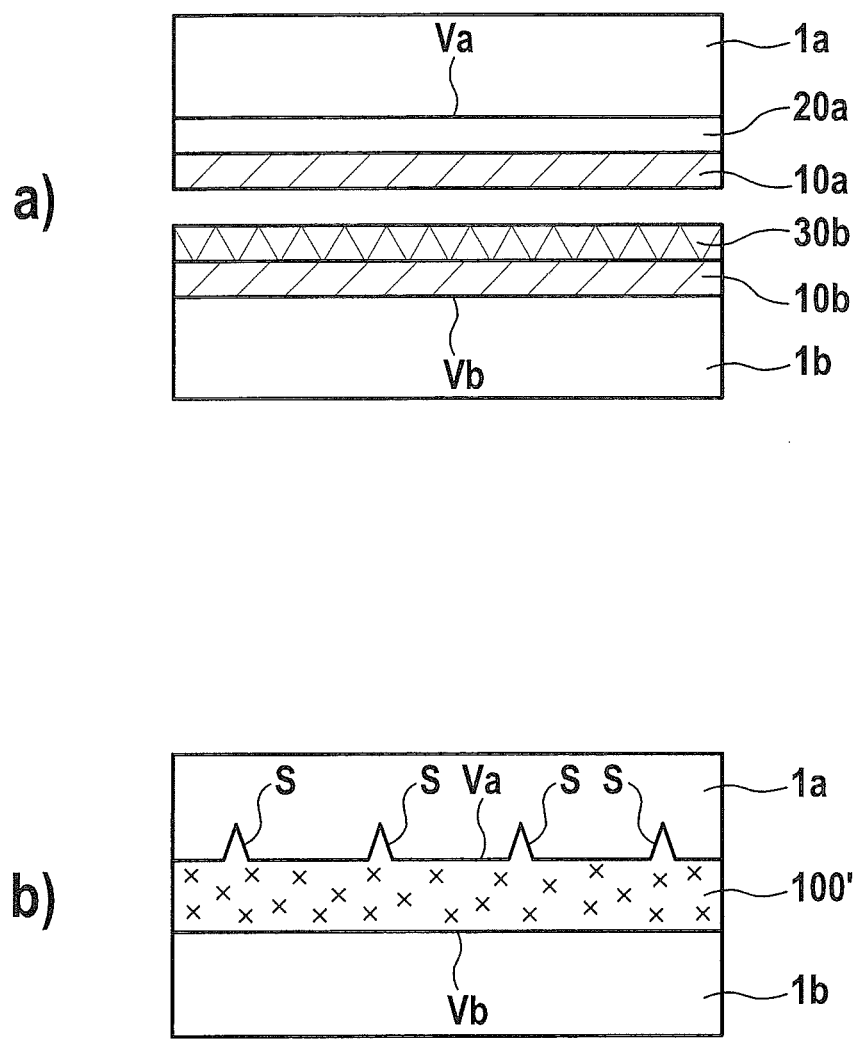
FIGS. 6a and 6b show schematic cross-sectional views to explain a method for bonding two silicon substrates, and a corresponding system of two silicon substrates according to a first specific embodiment of the present invention, that is, prior to the bonding, FIG. 6a and following the bonding, FIG. 6b.

FIG. 6a), b) show schematic cross-sectional views to explain a method for bonding two silicon substrates and a corresponding system of two silicon substrates according to a first specific embodiment of the present invention, that is, prior to the bonding, FIG. 6a) and following the bonding, FIG. 6b).

In the sixth specific embodiment, in contrast to the fifth specific embodiment, a bonding layer 10b of germanium is deposited on second bonding surface Vb, and the afore-described bonding layer 30b of aluminum-silicon-copper is deposited thereon.

Here, too, the development of spikes S in the thermal treatment step occurs only on first bonding surface Va.

Figure 7:
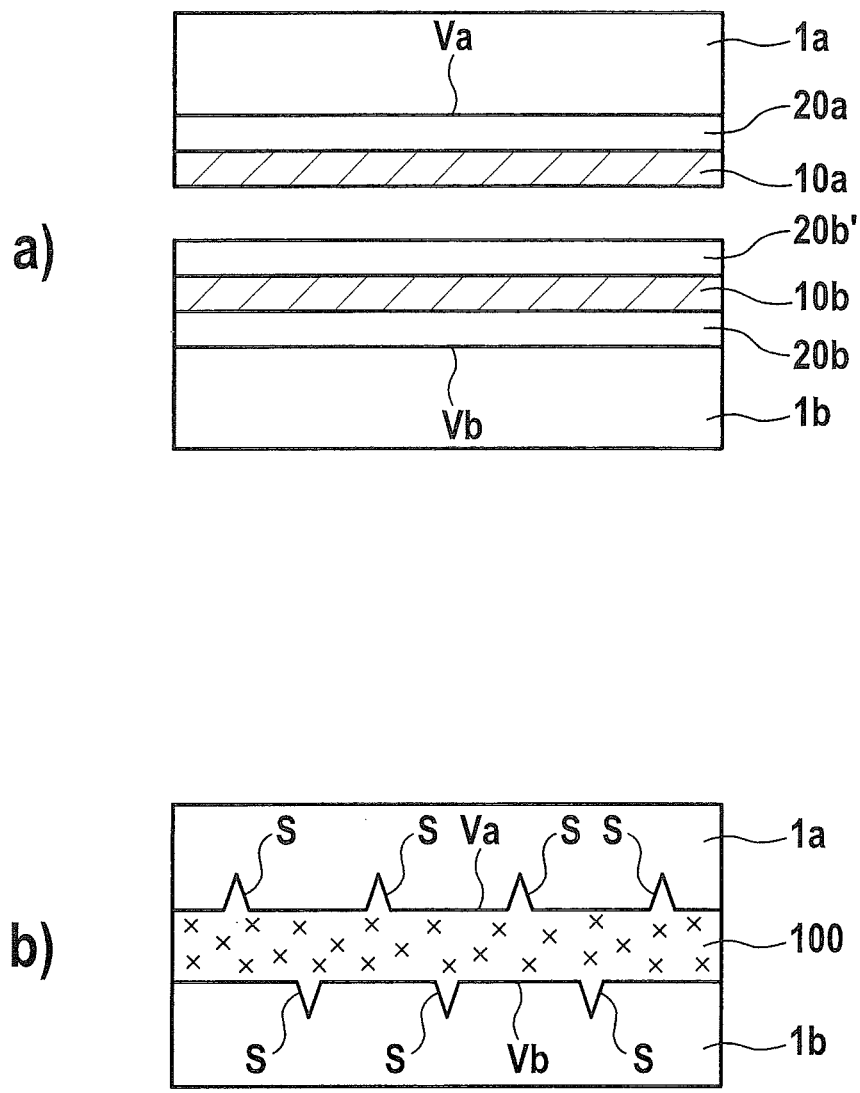
FIGS. 7a and 7b show schematic cross-sectional views to explain a method for bonding two silicon substrates, and a corresponding system of two silicon substrates according to a first specific embodiment of the present invention, that is, prior to the bonding, FIG. 7a and following the bonding, FIG. 7b.

FIG. 7a), b) show schematic cross-sectional views to explain a method for bonding two silicon substrates, and a corresponding system of two silicon substrates according to a first specific embodiment of the present invention, that is, prior to the bonding, FIG. 7a) and following the bonding, FIG. 7b).

In comparison to the second specific embodiment, in the seventh specific embodiment an additional bonding layer 20b' of pure aluminum or of aluminum-copper having the aforementioned copper component has been deposited on bonding layer 10b of germanium, above second bonding surface Vb.

Although the present invention has been described with the aid of exemplary embodiments, it is not limited to these. The mentioned materials and topologies in particular have merely exemplary character and are not restricted to the examples elucidated.

It should be mentioned specifically that the Al spike formation is able to be initialized in parallel with, but also prior to the formation of the eutectic bond. Like in many processes, there is a temperature and time-dependency here as well. If one stays below the eutectic bonding temperature, the Al-spiking process may already be started without a simultaneous initialization of a bonding connection. On the other hand, when using a temperature ramp which rapidly leads to the bonding temperature above the eutectic point, then the spiking process takes place virtually simultaneously with the eutectic bonding process.

What is claimed is:

1. A method for bonding two silicon substrates, the method comprising:
   providing a first silicon substrate and a second silicon substrate;
   depositing a first bonding layer of pure aluminum or of aluminum-copper having a copper component between 0.1% and 5% on a first bonding surface of the first silicon substrate;
   depositing a second bonding layer of germanium above the first bonding surface or above a second bonding surface of the second silicon substrate;
   subsequently bonding the first silicon substrate and the second silicon substrate, so that the first bonding surface and the second bonding surface lie opposite each other; and
   implementing a thermal treatment step to form a eutectic bonding layer of aluminum-germanium or containing aluminum-germanium as main component, between the first silicon substrate and the second silicon substrate, spikes, which contain aluminum as a minimum and extend into the first silicon substrate, forming at least on the first bonding surface.

2. The method of claim 1, further comprising:
   depositing, prior to depositing the second bonding layer of germanium, a third bonding layer of pure aluminum or of aluminum-copper having a copper component between 0.1% and 5% on the second bonding surface of the second silicon substrate, spikes, which contain aluminum as a minimum and extend into the second silicon substrate, forming on the second bonding surface during the thermal treatment.

3. The method of claim 2, further comprising:
   depositing, prior to the bonding, a fourth bonding layer of germanium or of aluminum-silicon-copper having a silicon component between 0.1% and 5% above the first bonding surface.

4. The method of claim 1, further comprising:
   depositing, prior to the bonding, a fifth bonding layer of aluminum-silicon-copper having a silicon component between 0.1 and 5% above the second bonding surface.

5. The method of claim 2, further comprising:
   depositing, prior to the bonding, a sixth bonding layer of pure aluminum or of aluminum-copper having a copper component between 0.1% and 5% above at least one of the first bonding surface and the second bonding surface.

6. The method of claim 1, wherein the thermal treatment is performed within a temperature range between 400° C. and 550° C.

7. The method of claim 1, wherein the copper component is between 0.5% and 1%.

8. The method of claim 3, wherein the silicon component is between 1% and 2%.

9. A system of two silicon substrates, comprising:
   a first silicon substrate;
   a second silicon substrate; and
   a eutectic bonding layer made of aluminum-germanium or having aluminum-germanium as main component of aluminum-germanium, between the first silicon substrate and the second silicon substrate, spikes, which contain aluminum as a minimum and extend into the first silicon substrate, forming at least on the first bonding surface.

10. The system of claim 9, wherein spikes which contain aluminum as a minimum and which extend into the second silicon substrate form on the second bonding surface.

11. The system of claim 9, wherein the first silicon substrate is a wafer substrate, and the second silicon substrate is a sensor-wafer substrate.

12. The system of claim 9, wherein the eutectic bonding layer has at least one of a copper component between 0.1% and 5%, and a silicon component between 0.1% and 5%.

13. The system of claim 11, wherein the first silicon substrate is a wafer substrate, which is a cap-wafer substrate, and the second silicon substrate is a sensor-wafer substrate.

14. The method of claim 1, wherein the thermal treatment is performed within a temperature range between 425° C. and 500° C.

* * * * *